(12) United States Patent
Shim et al.

(10) Patent No.: US 7,928,423 B2
(45) Date of Patent: Apr. 19, 2011

(54) PHASE CHANGE MEMORY DEVICE HAVING AN INVERSELY TAPERED BOTTOM ELECTRODE

(75) Inventors: Kew Chan Shim, Gyeonggi-do (KR); Jun Hyung Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/427,018

(22) Filed: Apr. 21, 2009

(65) Prior Publication Data

US 2010/0096612 A1 Apr. 22, 2010

(30) Foreign Application Priority Data

Oct. 20, 2008 (KR) .................. 10-2008-0102518

(51) Int. Cl.
*H01L 47/00* (2006.01)
(52) U.S. Cl. .............. 257/4; 257/E45.002; 257/E47.001
(58) Field of Classification Search ....... 257/4, E45.002, 257/E47.001
See application file for complete search history.

(56) References Cited

U.S. PATENT DOCUMENTS

| | | | | |
|---|---|---|---|---|
| 5,309,023 | A * | 5/1994 | Motonami et al. | 257/773 |
| 5,960,315 | A * | 9/1999 | Gambino et al. | 438/632 |
| 6,420,786 | B1 * | 7/2002 | Gonzalez et al. | 257/774 |
| 7,442,602 | B2 * | 10/2008 | Park et al. | 438/237 |
| 7,598,112 | B2 * | 10/2009 | Park et al. | 438/95 |
| 7,671,395 | B2 * | 3/2010 | Park et al. | 257/303 |
| 7,834,341 | B2 * | 11/2010 | Wu et al. | 257/4 |
| 2006/0006374 | A1 * | 1/2006 | Chang | 257/2 |
| 2006/0024429 | A1 * | 2/2006 | Horii | 427/97.7 |
| 2006/0098524 | A1 * | 5/2006 | Xu et al. | 365/232 |
| 2007/0070284 | A1 * | 3/2007 | Lee et al. | 349/153 |
| 2007/0158633 | A1 * | 7/2007 | Lai et al. | 257/4 |
| 2007/0246766 | A1 * | 10/2007 | Liu | 257/314 |
| 2008/0061282 | A1 * | 3/2008 | Sato et al. | 257/4 |
| 2008/0090400 | A1 * | 4/2008 | Cheek et al. | 438/597 |
| 2008/0149910 | A1 * | 6/2008 | An et al. | 257/4 |
| 2009/0039334 | A1 * | 2/2009 | Chae et al. | 257/4 |
| 2009/0166602 | A1 * | 7/2009 | Kum | 257/4 |
| 2009/0176354 | A1 * | 7/2009 | Rajendran et al. | 438/487 |
| 2009/0242865 | A1 * | 10/2009 | Lung et al. | 257/2 |
| 2010/0096610 | A1 * | 4/2010 | Wang et al. | 257/2 |

FOREIGN PATENT DOCUMENTS

| | | | | |
|---|---|---|---|---|
| KR | 2005001169 | A | * | 1/2005 |
| KR | 1020050001169 | A | | 1/2005 |
| KR | 10-0822800 | | | 4/2008 |

* cited by examiner

*Primary Examiner* — Ida M Soward
(74) *Attorney, Agent, or Firm* — Ladas & Parry LLP

(57) ABSTRACT

A phase change memory device having an inversely tapered bottom electrode and a method for forming the same is presented. The phase change memory device includes a semiconductor substrate, an insulation layer, a bottom electrode contact and a phase change pattern. The insulation layer includes a bottom electrode contact hole having an insulation sidewall spacer such that the bottom electrode contact hole has an upper portion diameter that is smaller than a lower portion diameter. The bottom electrode contact is formed within the bottom electrode contact hole. The phase change pattern is formed on the bottom electrode contact.

4 Claims, 5 Drawing Sheets

PHASE CHANGE MEMORY DEVICE HAVING AN INVERSELY TAPERED BOTTOM ELECTRODE

CROSS-REFERENCES TO RELATED APPLICATION

The present application claims priority under 35 U.S.C. §119(a) to Korean application number 10-2008-0102518, filed on Oct. 20, 2008, in the Korean Intellectual Property Office, which is incorporated herein by reference in its entirety as set forth in full.

BACKGROUND

1. Technical Field

The present invention relates to phase change memory devices, and more particularly, to a bottom electrode contact structure of a phase change memory device and a method for manufacturing the same.

2. Related Art

Generally semiconductor memory devices are divided into volatile memory devices and nonvolatile memory devices depending upon whether or not they hold data when the power supply is interrupted. Some typical representative volatile memory devices include DRAM devices and SRAM devices. A typical representative nonvolatile memory device includes a flash memory device. These types of volatile and nonvolatile memory devices function by exploiting a binary logic system of '0's or '1's depending upon whether or not they store electric charges at specific areas within these devices.

In recent times, a substantial amount of effort has been invested in the hopes of developing novel alternate memory devices that can provide most if not all of the advantages exhibited by devices such as nonvolatileness, random access, low power consumption, and high integration.

One new representative memory device developed in the hopes of achieving these needs and requirements is the phase change memory device. As stated above, the phase change memory device uses a phase change material that changes phases in response to being heated when electrical current passes through it. Generally, a phase change material made of germanium (Ge), stibium (Sb) and tellurium (Te), which are collectively referred to as GST, is used as the phase change material.

When the GST phase change material is in an amorphous state it exhibits a relatively high electric resistance. As the phase of the GST phase change material changes from the amorphous state to a more ordered crystalline state, the electric resistance across the GST phase change material decreases. Therefore, since the GST phase change material exhibits different electric resistance values as a function of the phase state, the GST phase change material can be exploited as a storage medium of a memory device which is responsive to differences in electric resistance.

Generally phase change memory devices are constructed to be supplied with heat that arises from bottom electrode contacts. Bottom electrode contacts are often formed of conductive nitrides such as titanium nitride (TiN). In this regard, in order to accomplish low power consumption, it is often necessary to decrease the diameter of the bottom electrode contacts. In conformity with this need bottom electrode contacts are currently formed having minimum diameters that can be obtained by lithographic equipment.

However, as is common in the conventional lithography, misalignment can occur when forming a mask for delimiting bottom electrodes, and critical dimension (CD) can vary due to the misalignment. This CD error can cause a problem in that precise contact between phase change layer patterns and the bottom electrode contacts cannot be ensured. As a result Joule's heat transfer and the phase change of a phase change layer are unlikely to be evenly implemented across the resultant memory device.

Under these circumstances, research has continued to develop a feasible methodology for decreasing the contact area between the phase change layer and the bottom electrode while being capable of minimizing CD error.

FIGS. 1A through 1E are sectional views illustrating the processes of a method for forming the bottom electrode contact of a conventional phase change memory device.

Referring to FIG. 1A, a first interlayer dielectric 20 is formed on a semiconductor substrate 10 having an impurity region 10a formed therein. Afterwards, a diode 25 is then formed in the first interlayer dielectric 20 in which the diode 25 is electrically connected with the impurity region 10a. An ohmic contact layer 30 is then formed on the upper surface of the diode 25. A second interlayer dielectric 40 is then formed on the first interlayer dielectric 20 and on the ohmic contact layer 30.

Referring to FIG. 1B, by etching a predetermined portion of the second interlayer dielectric 40 to expose the ohmic contact layer 30, a bottom electrode contact hole 41 is defined.

Referring to FIG. 1C, a bottom electrode contact layer 45 is deposited on the wall of the bottom electrode contact hole 41 and on the upper surface of the second interlayer dielectric 40. Thereupon, a buried layer 50 is formed on the bottom electrode contact layer 45 to fill the bottom electrode contact hole 41.

Referring to FIG. 1D, the buried layer 50 is CMPed (chemically and mechanically polished) to expose the second interlayer dielectric 40 by which a bottom electrode contact 45a is formed.

Referring to FIG. 1E, a phase change pattern 60 is then formed on the bottom electrode contact 45a.

In more conventional methodologies, when etching through the second interlayer dielectric 40 process to define the bottom electrode contact hole 41, an etchant gas may not reach deep enough to expose a sufficiently large area of the bottom electrode contact hole 41. This may be due to the thickness of the second interlayer dielectric 40 and/or may be due to the small diameter of the bottom electrode contact hole 41. As a result the resultant bottom electrode contact hole 41 may have a diameter that is smaller at the lower end than at the upper end of the bottom electrode contact hole 41.

If the bottom electrode contact hole 41 has a diameter that is smaller at the lower end than at the upper end then the contact area between the bottom electrode contact 45a and the diode 25 is diminished. As a result the current drivability of the diode 25 can deteriorate. Due to this fact, the amount of current cannot be sufficiently supplied to the bottom electrode contact 45a.

Also, in the case where transient etching is conducted to solve the problem, as the diameter at the upper end of the bottom electrode contact hole 41 increases, the area of the bottom electrode contact 45a, which undergoes a phase change between an amorphous state and a crystalline state, is also likely to be changed. Due to this fact, because set resistance and reset resistance increase, the characteristics of the phase change memory device can degrade.

SUMMARY

A phase change memory device that can prevent or at least minimize the degraded electrical characteristics outlined above is described herein.

Also, a method for manufacturing a phase change memory device that can realize a reduction in changes in set and reset resistances is described herein.

In one aspect, a phase change memory device comprises an insulation layer formed on a semiconductor substrate and having a bottom electrode contact hole having a diameter that is smaller at an upper end than at a lower end of the bottom electrode contact hole; a bottom electrode contact formed within in the bottom electrode contact hole; and a phase change pattern formed on the bottom electrode contact.

In another aspect, a phase change memory device comprises a semiconductor substrate including a switching element for transmitting current; an insulation layer formed on the semiconductor substrate and having a contact hole which is defined at a position corresponding to the switching element; an insulation spacer formed on a sidewall of the contact hole and rendering an inversely tapered sidewall on the contact hole; a bottom electrode contact formed on a bottom of the contact hole and on the inversely tapered sidewall of the insulation spacer; and a phase change pattern electrically connected with the bottom electrode contact.

In still another aspect, a method for manufacturing a phase change memory device is provided. In the method, a semiconductor substrate is first prepared, and an interlayer dielectric, which has a preliminary contact hole, is formed on the semiconductor substrate. An insulation spacer is formed on a sidewall of the preliminary contact hole forming a inversely tapered sidewall, and thereby the bottom electrode contact hole has the sectional shape of a trapezoid. Then, a bottom electrode contact is formed within the bottom electrode contact hole. Thereupon, a phase change pattern is formed on the bottom electrode contact.

BRIEF DESCRIPTION OF THE DRAWINGS

The above objects, and other features and advantages will become more apparent after a reading of the following detailed description taken in conjunction with the drawings, in which.

DETAILED DESCRIPTION

Hereafter, an exemplary embodiment of the present invention will be described with reference to the accompanying drawings.

FIGS. 2A through 2E are sectional views illustrating the processes of a method for forming the bottom electrode contact of a phase change memory device in accordance with an embodiment of the present invention.

Figure 1A:
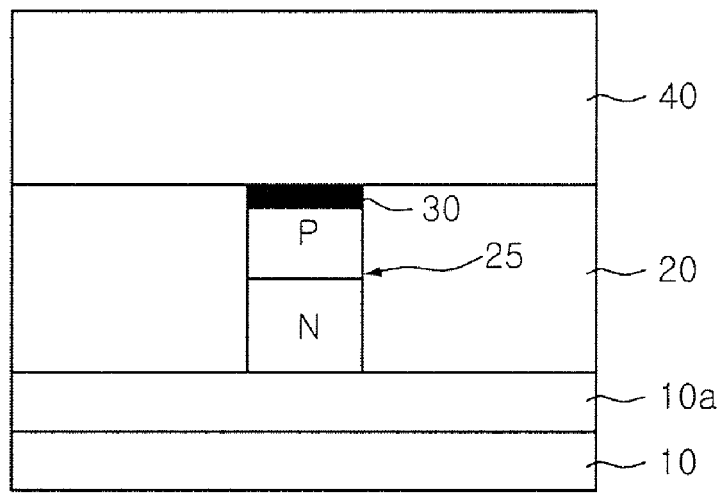
FIGS. 1A through 1E are sectional views illustrating the processes of a method for forming the bottom electrode contact of a conventional phase change memory device.
Figure 1B:
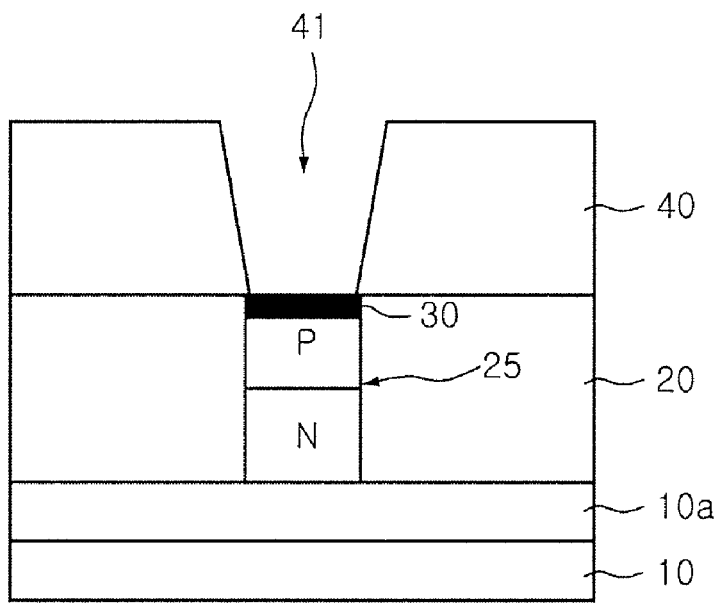
Figure 1C:
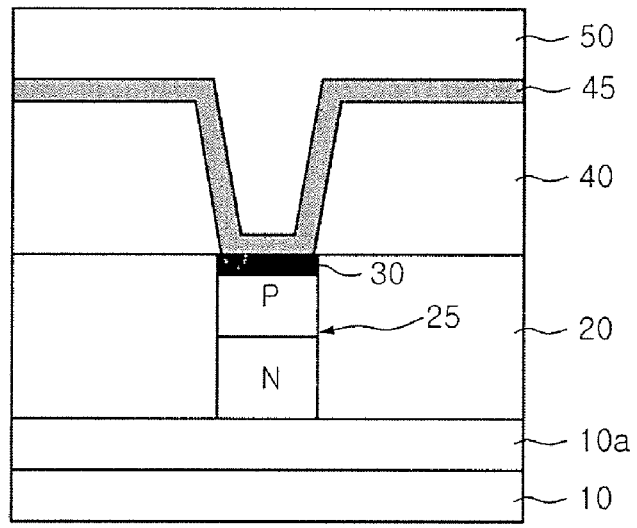
Figure 1D:
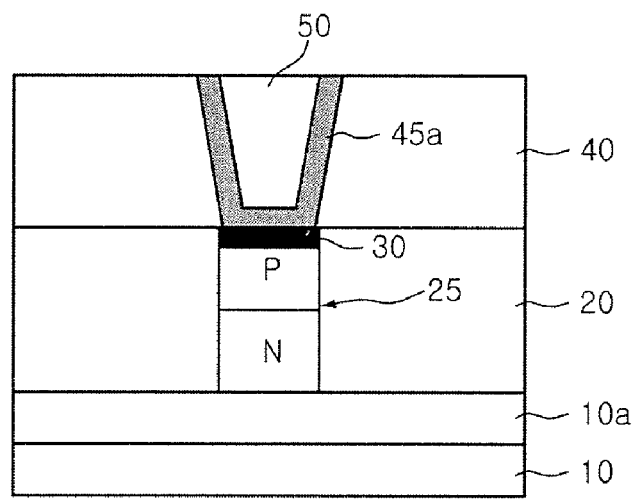
Figure 1E:
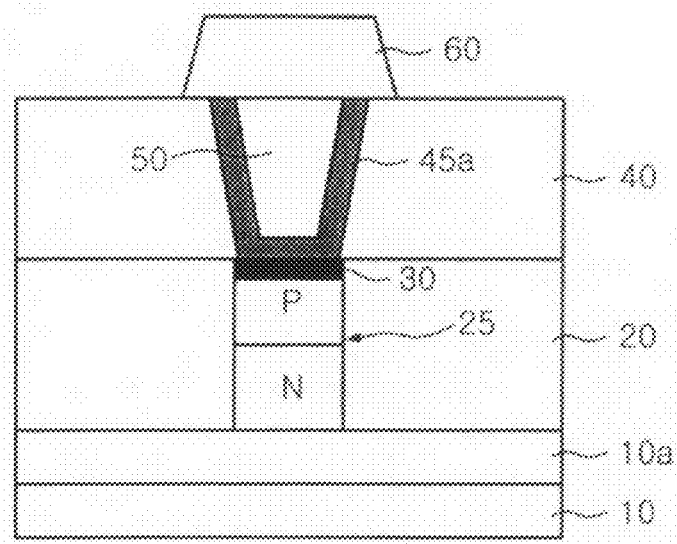
Figure 2A:
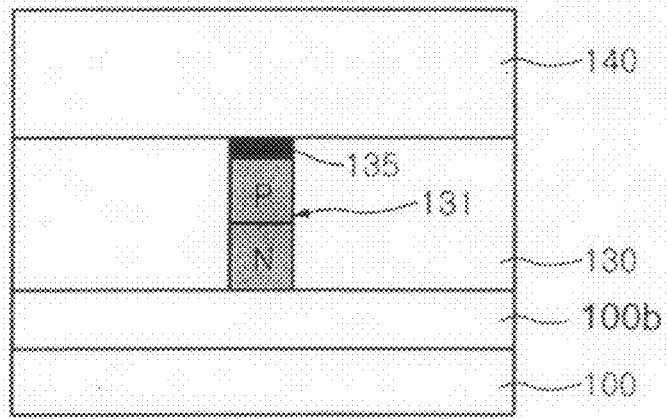
FIGS. 2A through 2E are sectional views illustrating the processes of a method for forming the bottom electrode contact of a phase change memory device in accordance with an embodiment of the present invention.

First, referring to FIG. 2A, an impurity region 100*b* is formed in a semiconductor substrate 100, for example, a silicon substrate. After forming a first interlayer dielectric 130 on the semiconductor substrate 100, a switching element 131 is formed in the first interlayer dielectric 130 that electrically contacts the impurity region 100*b*. In the embodiment, a PN diode can be employed as the switching element 131. For example, the PN diode can be an n-type SEG (selective epitaxial growth) layer stacked on a p-type SEG layer. The PN diode can be formed in any number of different ways.

When the switching element 131 is formed of a silicon constituent, an ohmic contact layer 135 is formed on the switching element 131. The ohmic contact layer 135 can include, for example, a metal silicide layer and can be formed through selective deposition. In one embodiment, cobalt silicide ($CoSi_2$) is employed as the ohmic contact layer 135. A second interlayer dielectric 140 is formed on the first interlayer dielectric 130 and on the switching element 131. The second interlayer dielectric 140 serves as a layer for insulating subsequently formed bottom electrode contacts from one another and for establishing the height of the bottom electrode contacts. Regarding the second interlayer dielectric 140, silicon nitride $Si_3N_4$ can be used because it exhibits excellent heat resistance properties.

Figure 2B:
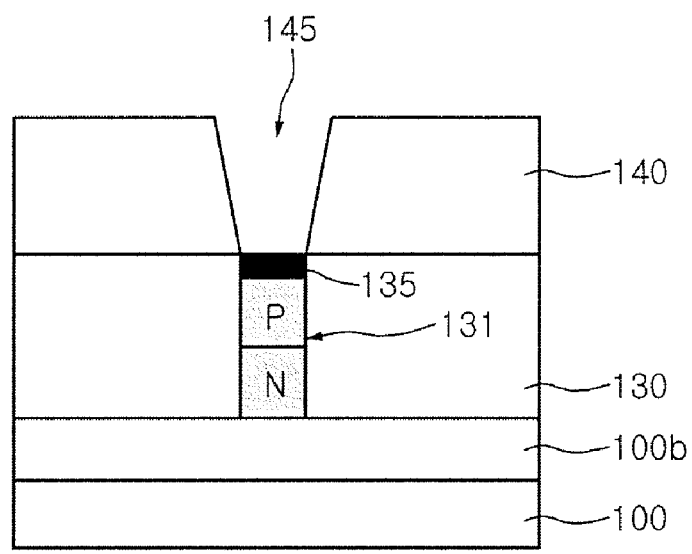

Referring to FIG. 2B, a preliminary bottom electrode contact hole 145 is defined by etching a predetermined portion of the second interlayer dielectric 140 to expose the upper surface of the ohmic contact layer 135. The etching process for defining the preliminary bottom electrode contact hole 145 can be conducted in any manner such as using a dry etching method. When conducting the etching process for defining the preliminary bottom electrode contact hole 145, the sidewall of the preliminary bottom electrode contact hole 145 can be tapered or not.

Figure 2C:
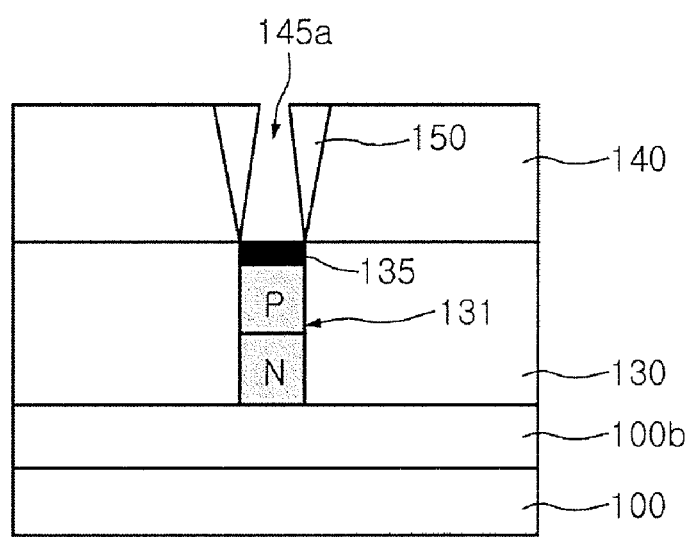

Referring to FIG. 2C, an insulation sidewall spacer 150 is then formed on the sidewall of the preliminary bottom electrode contact hole 145 to provide an inversely tapered sidewall. Therefore, for example, the insulation sidewall spacer 150 can have an inverted triangle sectional shape. By forming the insulation sidewall spacer 150 on the sidewall of the preliminary bottom electrode contact hole 145 in this manner, the diameter of the preliminary bottom electrode contact hole 145 is controlled by significantly decreasing the upper portion of the preliminary bottom electrode contact hole 145 as compared with a lower portion of the preliminary bottom electrode contact hole 145. Here, the reference numeral 145*a* will be used to designate a bottom electrode contact hole having a diameter that is smaller at the upper portion than at the lower portion of the bottom electrode contact hole, that is, having the cross sectional shape such as a trapezoid.

The insulation sidewall spacer 150 can be formed in a PE (plasma enhanced) type. If the insulation sidewall spacer 150 is formed in a PE type, due to the characteristics of plasma, the insulation sidewall spacer 150 is deposited to form an overhang not at the lower portion but at the upper portion of the bottom electrode contact hole 145*a*. In this illustrative embodiment, the insulation sidewall spacer 150 is shown barely, if any, deposited at the bottom portion of the bottom electrode contact hole 145*a*. Even when the insulation sidewall spacer 150 is deposited on the bottom portion of the bottom electrode contact hole 145*a*, only a relatively small amount of insulation sidewall spacer 150 is deposited. In the latter case, the insulation sidewall spacer 150 can be easily removed by using a number of techniques such as using an argon (Ar) plasma sputtering process (not illustrated) which can be subsequently performed.

The insulation sidewall spacer 150 can be formed using the same material as that of the second interlayer dielectric 140. In this embodiment, a nitride spacer is employed as the insulation sidewall spacer 150. The nitride spacer can be formed at a temperature of 350~450° C. under a pressure of 2~12 Torr by using RF power of 0.2~1.0 kW when supplying a silane gas ($SiH_4$) of 20~100 sccm and ammonia ($NH_3$) for 30~150 seconds.

Figure 2D:
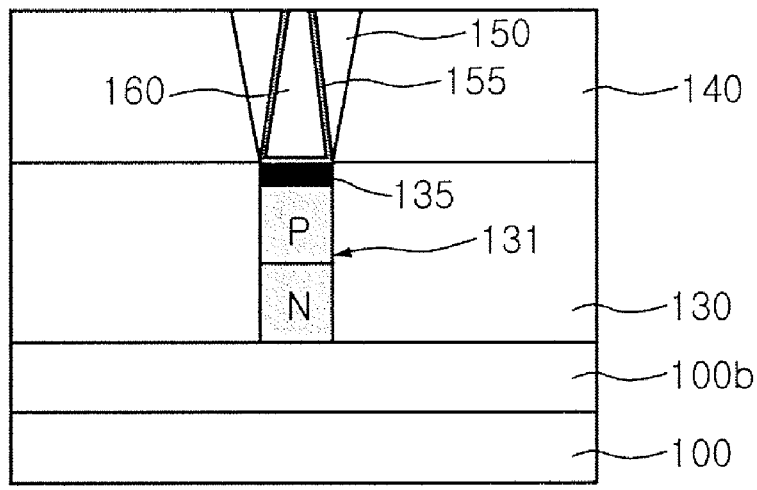

Referring to FIG. 2D, a conductive layer for a bottom electrode contact is then deposited along the surface of the bottom electrode contact hole 145*a* in which the insulation sidewall spacer 150 is formed. The conductive layer for a bottom electrode contact can be any conductive layer such as those selected from the group consisting of titanium (Ti), titanium nitride (TiN) or titanium aluminum nitride (TiAlN).

Afterwards a filler material 160, for example, an SOD (spin-on dielectric) layer having excellent step coverage, is formed to subsequently fill in the bottom electrode contact hole 145*a*. One reason why the SOD layer is used is that it prevent or at least minimizes the occurrence of voids from being produced in the bottom electrode contact hole 145*a*. Since the SOD layer is applied in its liquid phase, it is thought that it is more likely to completely fill these voids by using spin coating. The spun on SOD layer is then annealed at a temperature of 600~800° C. to solidify the SOD layer. Alternately instead of using the SOD layer any number of different fillers may be used such as those selected from the group consisting of an HDP (high density plasma) insulation layer, an $O_3$ USG (undoped silicate glass) layer, a TEOS (tetra ethyl ortho silicate) layer, and an HLD (high temperature low pressure dielectric) layer.

Thereafter, by planarizing the filler material 160 and the conductive layer for a bottom electrode contact to expose the second interlayer dielectric 140, a bottom electrode contact 155 is formed in the bottom electrode contact hole 145*a*. The planarization can be performed through CMP (chemical mechanical polishing).

Figure 2E:
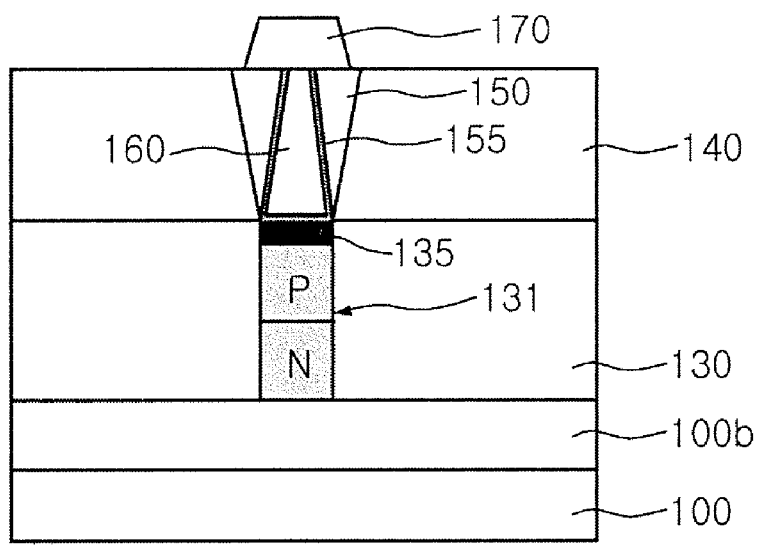

Referring now to FIG. 2E, a phase change pattern 170 is then formed on the bottom electrode contact 155 to electrically connect it with the bottom electrode contact 155.

As is apparent from the above detailed description of the present invention, the lower end diameter of a bottom electrode contact can be sufficiently secured to assure a good electrical contact, and the upper end diameter of the bottom electrode contact can be controllably decreased. As a result the driving current through the diode below can be controlled by physically restricting the size of the electrical contact available at the upper end of the bottom electrode contact 155.

As a consequence, the current drivability characteristics of a diode, i.e., the switching element, can be improved. As a result changes in the set and reset resistances can be reduced.

Although an exemplary embodiment has been described for illustrative purposes, those skilled in the art will appreciate that various modifications, additions and substitutions are possible, without departing from the scope and the spirit as disclosed in the accompanying claims.

What is claimed is:

1. A phase change memory device comprising:
    a semiconductor substrate including a switching element for transmitting current;
    an insulation layer formed on the semiconductor substrate and on the switching element, the insulation layer having a contact hole at a position corresponding to the switching element;
    an insulation sidewall spacer formed on the contact hole, the insulation sidewall spacer rendering the contact hole to have a diameter of an upper portion smaller than a lower portion;
    a bottom electrode contact formed within the contact hole and on the insulation sidewall spacer;
    a phase change pattern electrically connected to the bottom electrode contact; and
    a filler material is interposed in a space between the bottom electrode contact and the phase change pattern.

2. The phase change memory device according to claim 1, wherein the insulation sidewall spacer has an inverted triangle cross sectional shape.

3. The phase change memory device according to claim 1, wherein the insulation spacer is made of substantially the same material as the insulation layer.

4. The phase change memory device according to claim 1, wherein the filler material comprises any one selected from the group consisting of an SOD (spin-on-dielectric) layer, an HDP (high density plasma) insulation layer, an $O_3$ USG (undoped silicate glass) layer, a TEOS (tetra ethyl ortho silicate) layer, and an HLD (high temperature low pressure dielectric) layer.

* * * * *